United States Patent
Carcasi et al.

(10) Patent No.: US 10,551,743 B2
(45) Date of Patent: Feb. 4, 2020

(54) CRITICAL DIMENSION CONTROL BY USE OF PHOTO-SENSITIZED CHEMICALS OR PHOTO-SENSITIZED CHEMICALLY AMPLIFIED RESIST

(71) Applicant: Tokyo Electron Limited, Tokyo (JP)

(72) Inventors: Michael A. Carcasi, Austin, TX (US); Anton J. deVilliers, Clifton Park, NY (US)

(73) Assignee: Tokyo Electron Limited, Tokyo (JP)

(*) Notice: Subject to any disclaimer, the term of this patent is extended or adjusted under 35 U.S.C. 154(b) by 155 days.

(21) Appl. No.: 15/594,139

(22) Filed: May 12, 2017

(65) Prior Publication Data

US 2017/0329229 A1    Nov. 16, 2017

Related U.S. Application Data

(60) Provisional application No. 62/335,977, filed on May 13, 2016.

(51) Int. Cl.
 *G03F 7/20* (2006.01)
 *G03F 7/40* (2006.01)
 (Continued)

(52) U.S. Cl.
 CPC .......... *G03F 7/2024* (2013.01); *G03F 7/0382* (2013.01); *G03F 7/0392* (2013.01);
 (Continued)

(58) Field of Classification Search
 CPC ... G03F 7/7045; G03F 7/70466; H01L 22/12; H01L 22/20; H01L 21/0274; H01L 21/31144; H01L 21/67253
 (Continued)

(56) References Cited

U.S. PATENT DOCUMENTS 4,402,571 A    9/1983    Cowan et al.
4,609,615 A    9/1986    Yamashita et al.
 (Continued)

FOREIGN PATENT DOCUMENTS

CN    101738872 B    4/2013
EP    583205 A1    2/1994
 (Continued)

OTHER PUBLICATIONS

Semiconductor OneSource: Semiconductor Glossary—Search for : critical dimension, cd copyright 2016, one page (Year: 2016).*
 (Continued)

*Primary Examiner* — Cynthia Hamilton
(74) *Attorney, Agent, or Firm* — Wood Herron & Evans LLP

(57) ABSTRACT

A method for critical dimension control in which a substrate is received having an underlying layer and a radiation-sensitive material layer thereon. The radiation-sensitive material is exposed through a patterned mask to a first wavelength of light in the UV spectrum, and developed a first time. The radiation-sensitive material is flood exposed to a second wavelength of light different from the first wavelength of light and developed a second time to form a pattern. Prior to flood exposure, the radiation-sensitive material has a first light wavelength activation threshold that controls generation of acid to a first acid concentration in the radiation-sensitive material layer and controls generation of photosensitizer molecules in the radiation-sensitive material layer, and a second light wavelength activation threshold different than the first light wavelength activation threshold that can excite the photosensitizer molecules resulting in the acid comprising a second acid concentration greater than the first acid concentration.

26 Claims, 3 Drawing Sheets

(51) Int. Cl.

| | | |
|---|---|---|
| *G03F 7/038* | (2006.01) | |
| *G03F 7/039* | (2006.01) | |
| *G03F 7/11* | (2006.01) | |
| *G03F 7/16* | (2006.01) | |
| *G03F 7/38* | (2006.01) | |
| *G06K 9/62* | (2006.01) | |

(52) U.S. Cl.
CPC .................. *G03F 7/11* (2013.01); *G03F 7/16* (2013.01); *G03F 7/162* (2013.01); *G03F 7/2004* (2013.01); *G03F 7/38* (2013.01); *G03F 7/40* (2013.01); *G03F 7/405* (2013.01); *G03F 7/70466* (2013.01); *G06K 9/6201* (2013.01)

(58) Field of Classification Search
USPC .................................................. 430/394, 494
See application file for complete search history.

(56) References Cited

U.S. PATENT DOCUMENTS

| | | | |
|---|---|---|---|
| 4,751,169 | A | 6/1988 | Behringer et al. |
| 4,804,612 | A | 2/1989 | Asaumi et al. |
| 4,931,380 | A | 6/1990 | Owens et al. |
| 4,933,263 | A | 6/1990 | Okuda et al. |
| 5,370,973 | A | 12/1994 | Nishii |
| 5,534,970 | A | 7/1996 | Nakashima et al. |
| 5,707,784 | A | 1/1998 | Oikawa et al. |
| 5,820,679 | A | 10/1998 | Yokoyama et al. |
| 5,905,019 | A | 5/1999 | Obszarny |
| 6,180,320 | B1 | 1/2001 | Saito et al. |
| 6,242,160 | B1 | 6/2001 | Fukuzawa et al. |
| 6,245,492 | B1 | 6/2001 | Huang et al. |
| 6,296,985 | B1 | 10/2001 | Mizutani et al. |
| 6,331,383 | B1 | 12/2001 | Sakai |
| 6,440,632 | B2 | 8/2002 | Yasuda |
| 6,555,479 | B1 | 4/2003 | Hause et al. |
| 6,844,135 | B2 | 1/2005 | Kon et al. |
| 6,900,001 | B2 | 5/2005 | Livesay et al. |
| 6,968,253 | B2 | 11/2005 | Mack et al. |
| 7,142,941 | B2 | 11/2006 | Mack et al. |
| 7,327,436 | B2 | 2/2008 | Fukuhara et al. |
| 7,488,933 | B2 | 2/2009 | Ye et al. |
| 7,829,269 | B1 | 11/2010 | Fonseca et al. |
| 7,858,289 | B2 | 12/2010 | Yamashita |
| 7,966,582 | B2 | 6/2011 | Melvin, III et al. |
| 8,088,548 | B2 | 1/2012 | Houlihan et al. |
| 8,428,762 | B2 | 4/2013 | Graves et al. |
| 8,443,308 | B2 | 5/2013 | Shiely et al. |
| 8,589,827 | B2 | 11/2013 | Biafore et al. |
| 9,009,647 | B2 | 4/2015 | Ye et al. |
| 9,519,227 | B2 | 12/2016 | Carcasi et al. |
| 9,618,848 | B2 | 4/2017 | Carcasi et al. |
| 9,645,495 | B2 | 5/2017 | deVilliers |
| 9,746,774 | B2 | 8/2017 | Carcasi et al. |
| 2002/0030800 | A1 | 3/2002 | Nellissen |
| 2002/0102490 | A1 | 8/2002 | Ito et al. |
| 2003/0049571 | A1 | 3/2003 | Hallock et al. |
| 2003/0163295 | A1 | 8/2003 | Jakatdar et al. |
| 2005/0008864 | A1 | 1/2005 | Ingen Schenau et al. |
| 2005/0214674 | A1 | 9/2005 | Sui et al. |
| 2006/0040208 | A1 | 2/2006 | Tarutani et al. |
| 2006/0269879 | A1 | 11/2006 | Elian et al. |
| 2007/0032896 | A1 | 2/2007 | Ye et al. |
| 2007/0184648 | A1 | 8/2007 | Yoon et al. |
| 2007/0275330 | A1 | 11/2007 | Bailey et al. |
| 2007/0292770 | A1 | 12/2007 | Strauss |
| 2008/0038675 | A1 | 2/2008 | Nagasaka |
| 2008/0230722 | A1 | 9/2008 | Elian |
| 2009/0162796 | A1 | 6/2009 | Yun et al. |
| 2009/0214985 | A1 | 8/2009 | Kulp |
| 2009/0274974 | A1 | 11/2009 | Abdallah et al. |
| 2010/0119972 | A1 | 5/2010 | Houlihan et al. |
| 2010/0213580 | A1 | 8/2010 | Meador et al. |
| 2010/0245790 | A1 | 9/2010 | Seltmann et al. |
| 2010/0273099 | A1 | 10/2010 | Fonseca et al. |
| 2010/0291490 | A1 | 11/2010 | Tsuruda et al. |
| 2011/0043791 | A1 | 2/2011 | Smilde et al. |
| 2011/0147984 | A1 | 6/2011 | Cheng et al. |
| 2011/0171569 | A1 | 7/2011 | Nishimae et al. |
| 2011/0177464 | A1 | 7/2011 | Takeda et al. |
| 2011/0205505 | A1 | 8/2011 | Somervell et al. |
| 2011/0250540 | A1 | 10/2011 | Huang et al. |
| 2013/0084532 | A1 | 4/2013 | Wu et al. |
| 2013/0164691 | A1 | 6/2013 | Shiobara |
| 2013/0171571 | A1 | 7/2013 | Dunn et al. |
| 2013/0204594 | A1 | 8/2013 | Liu |
| 2013/0232457 | A1 | 9/2013 | Ye et al. |
| 2013/0234294 | A1 | 9/2013 | Hu et al. |
| 2013/0260313 | A1 | 10/2013 | Allen et al. |
| 2014/0227538 | A1 | 8/2014 | Baldwin et al. |
| 2015/0214056 | A1 | 7/2015 | Xu et al. |
| 2015/0241781 | A1 | 8/2015 | Carcasi et al. |
| 2015/0241782 | A1 | 8/2015 | Scheer et al. |
| 2015/0241783 | A1 | 8/2015 | Carcasi et al. |
| 2015/0241793 | A1 | 8/2015 | Carcasi et al. |
| 2016/0004160 | A1 | 1/2016 | Tagawa et al. |
| 2016/0048080 | A1 | 2/2016 | deVilliers |
| 2016/0357103 | A1 | 12/2016 | Nagahara et al. |
| 2017/0052448 | A1 | 2/2017 | Nakagawa et al. |
| 2017/0052449 | A1 | 2/2017 | Nakagawa et al. |
| 2017/0052450 | A1 | 2/2017 | Nakagawa et al. |
| 2017/0192357 | A1 | 7/2017 | Carcasi et al. |
| 2017/0242342 | A1 | 8/2017 | Carcasi et al. |
| 2017/0242344 | A1 | 8/2017 | Carcasi et al. |
| 2017/0329229 | A1 | 11/2017 | Carcasi et al. |
| 2017/0330806 | A1 | 11/2017 | deVilliers et al. |

FOREIGN PATENT DOCUMENTS

| | | |
|---|---|---|
| EP | 2048700 A2 | 4/2009 |
| JP | 04-239116 A | 8/1992 |
| JP | 09-211871 A | 8/1992 |
| JP | 2000-208408 A | 7/2000 |
| JP | 2002006512 A | 1/2002 |
| JP | 2007501431 A | 1/2007 |
| JP | 2007334036 A | 12/2007 |
| JP | 2013140319 A | 7/2013 |
| JP | 2013228447 A | 11/2013 |
| JP | 2014-29435 A | 2/2014 |
| JP | 2015172741 A | 10/2015 |
| KR | 20120058572 A | 6/2012 |
| TW | I273457 B | 2/2007 |
| TW | 201539539 A | 10/2015 |
| TW | 201541194 A | 11/2015 |
| WO | 2003001297 A2 | 1/2003 |
| WO | 2013007442 A1 | 1/2013 |
| WO | 2005013007 A1 | 2/2015 |

OTHER PUBLICATIONS

Kang et al, Microelectronics Reliablity 46 (2006) 1006-1012. (Year: 2006).*
Definition of critical_dimension_cd—Chemisty Dictionary Definition of crical dimesnion (CD) copyright 2017 one page from chemicool.com. (Year: 2017).*
S. Tagawa, et al., "Super High Sensitivity Enhancement by Photo-Sensitized Chemically Amplified Resist Process", Journal of Photopolymer Science and Technology, vol. 26, No. 6 (2013), pp. 825-830.
S. Tagawa, et al., "New Sensitization Method of Chemically Amplified EUV/EB Resists," presented at the 2013 International Symposium on EUV Lithography, Toyama, Japan, Oct. 6-10, 2013.
A. Ravve, "Light-Associated Reactions of Synthetic Polymers", Springer Science-Business Media, ISBN 0387318038, pp. 23-25, 2006.
International Searching Authority, Search Report and Written Opinion issued in related International Application PCT/US2015/017056, dated May 29, 2015, 10 pp, related to U.S. Appl. No. 14/628,542.

(56) References Cited

OTHER PUBLICATIONS

International Searching Authority, Search Report and Written Opinion issued in related International Application PCT/US2015/017071, dated May 29, 2015, 13 pp, related to U.S. Appl. No. 14/628,282.
Lowes et al. "Comparative study of photosensitive versus Non-photosensitive developer-soluble bottom anti-reflective coating system", ECS Transactions 27(1), pp. 503-508 (2010).
"Understanding Brewer Science ARC products", Brewer Science (23 pages (2002)).
Japan Patent Office, Official Action issued in related JP Patent Application No. 2016-553436 dated May 23, 2017, 18 pp., including English translation.
U.S. Patent and Trademark Office, Fiinal Office Action issued in related U.S. Appl. No. 14/629,968 dated Jun. 1, 2017, 20 pp.
Japan Patent Office, Official Action issued in related JP Patent Application No. 2016-553422 dated May 30, 2017, 8 pp., including English translation.
Nagahara et al., Challenge Toward Breakage of RLS Trade-off for UEV Lithography by Photosensitized Chemically Amplified Resist (PSCAR) with Flood Exposure, SPIE International Society for Optical Engineering Proceedings, vol. 9776, Mar. 18, 2016, 18 pp.
International Searching Authority, Search Report and Written Opinion issued in related International Application PCT/US2017/032435, dated Aug. 14, 2017, 14 pp.
International Searching Authority, Search Report and Written Opinion issued in related International Application PCT/US2017/032450, dated Aug. 10, 2017, 12 pp, related to U.S. Appl. No. 15/594,187.
U.S. Patent and Trademark Office, Office Action issued in related U.S. Appl. No. 14/629,968 dated Aug. 23, 2017, 27 pp.
International Searching Authority, Search Report and Written Opinion issued in related International Application PCT/US2017/018332 dated Jun. 1, 2017, 12 pp, related to U.S. Appl. No. 15/048,584.
International Searching Authority, Search Report and Written Opinion issued in related International Application PCT/US2017/018337 dated Jun. 5, 2017, 12 pp, related to U.S. Appl. No. 15/048,619.
Korean Intellectual Property Office, English translation of Office Action issued in related KR Patent Application No. 2016-7025792 dated Oct. 18, 2017, 7 pp.
Korean Intellectual Property Office, English translation of Office Action issued in related KR Patent Application No. 2016-7026114 dated Oct. 17, 2017, 5 pp.
U.S. Patent and Trademark Office, Non-final Office Action issued in related U.S. Appl. No. 15/048,619 dated Dec. 6, 2017, 17 pp.
Japan Patent Office, Office Action issued in related JP Application No. 2016-553436 dated Dec. 12, 2017, 16 pp. including English translation.
Taiwan Intellectual Property Office, Notice of Examination Opinions issued in counterpart application TW Application No. 106105400 dated Mar. 28, 2018, 13 pp, including English translation.
U.S. Patent and Trademark Office, Non-final Office Action issued in corresponding U.S. Appl. No. 15/594,187 dated Mar. 22, 2018, 53 pp.
U.S. Patent and Trademark Office, Non-final Office Action issued in corresponding U.S. Appl. No. 15/445,738 dated Apr. 11, 2018, 56 pp.
Taiwan Intellectual Property Office; Notice of Examination Opinions issued in counterpart application TW Application No. 106115716 dated Jun. 8, 2018, 9 pp. including English translation.
Japan Patent Office, Office Action issued in related JP Patent Application No. 2016-553436 dated Jun. 19, 2018, 10 pp., including English translation.
U.S. Patent and Trademark Office, Non-final Office Action issued in corresponding U.S. Appl. No. 15/048,584 dated Aug. 8, 2018, 45 pp.
International Bureau of WIPO, International Preliminary Report on Patentability issued in related International Application No. PCT/US2015/017056 dated Aug. 30, 2016, 7 pp.
International Bureau of WIPO, International Preliminary Report on Patentability issued in related International Application No. PCT/US2015/017071 dated Aug. 30, 2016, 10 pp.
Taiwan Intellectual Property Office, Office Action issued in related TW Patent Application No. 106105403 dated Jun. 28, 2018, 7 pp., including English translation.
PCT Office, International Preliminary Report on Patentability issued in PCT/US2017/032435 dated Nov. 22, 2018, 8 pages.
U.S. Patent and Trademark Office, Office Action in corresponding U.S. Appl. No. 15/445,738 dated Sep. 14, 2018.
Taiwan Intellectual Property Office, Notice of Allowance issued in corresponding Taiwanese Patent Application No. 106115728 dated Feb. 15, 2019.
U.S. Patent and Trademark Office, Office Action issued in corresponding U.S. Appl. No. 16/154,018 dated Mar. 8, 2019.
U.S. Patent and Trademark Office, Office Action issued in corresponding U.S. Appl. No. 15/048,584 dated Feb. 15, 2019.
Wang, C.W. et al., "Photobase generator and photo decomposable quencher for high-resolution photoresist applications," Proc. SPIE 7639, Advances in Resist Materials and Processing Technology XXVII, 76390W (Mar. 29, 2010).
U.S. Patent and Trademark Office, Office Action in corresponding U.S. Appl. No. 15/445,738 dated Apr. 15, 2019.
Wolf, Stanley and Tauber, Richard, Silicon Processing for the VLSI Era, vol. 1, Process Technology, Lattice Press, Sunset Beach, CA, 1986.
PCT Office, International Preliminary Report on Patentability issued in PCT/US2017/032450 dated Nov. 22, 2018, 8 pages.
U.S. Patent and Trademark Office, Office Action issued in corresponding U.S. Appl. No. 15/445,738 dated Sep. 14, 2018, 25 pages.
U.S. Patent and Trademark Office, Advisory Action issued in corresponding U.S. Appl. No. 15/445,738 dated Jan. 3, 2019, 8 pages.
Japanese Patent Office, Office Action in corresponding Japanese Patent Application No. 2016-570931 dated Aug. 20, 2019.

* cited by examiner

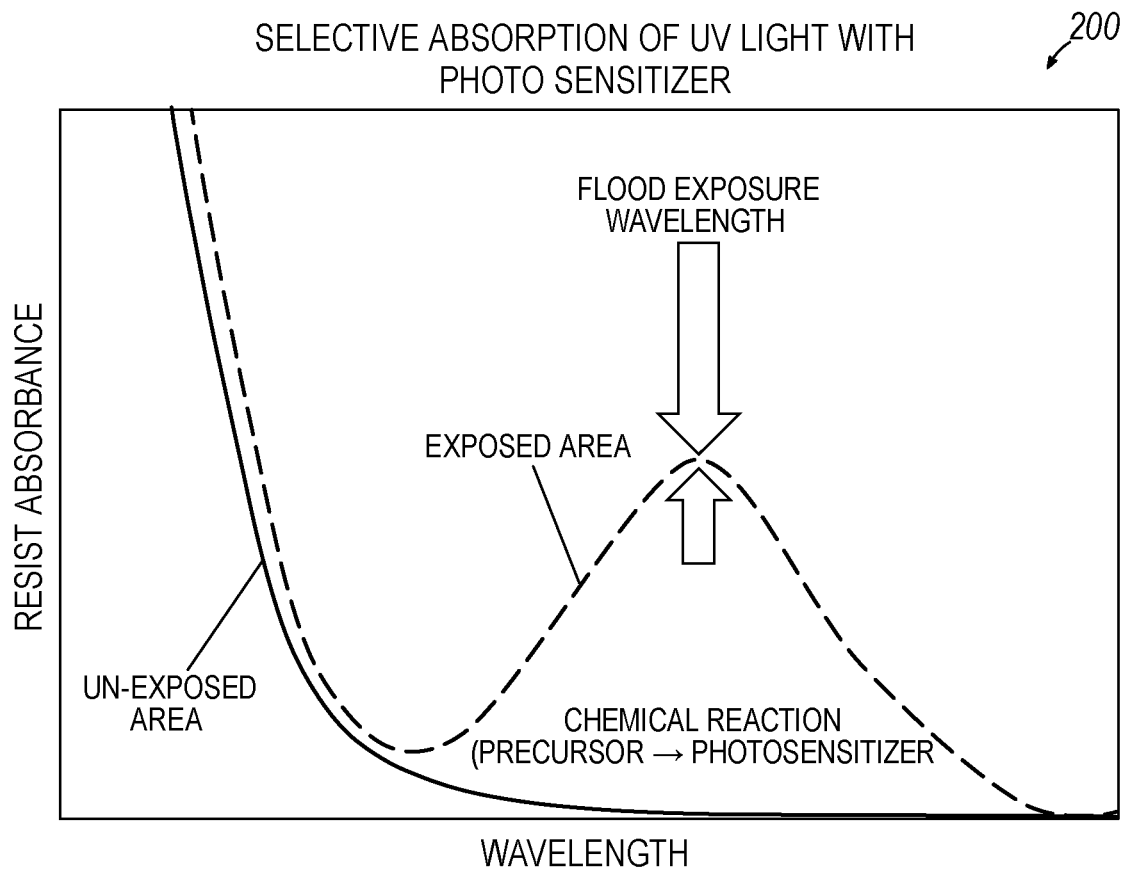

FIG. 2

| ROTATION (RPM) | SCAN RATE (mm/s) | POWER (W/cm²) | LIGHT WORKING DISTANCE (mm) | APERTURE (if used) | FOCUS POSITION |
|---|---|---|---|---|---|
| CONSTANT | CONSTANT | CONSTANT | CONSTANT | CONSTANT | CONSTANT |
| CONSTANT | CONSTANT | VARIABLE | CONSTANT | CONSTANT | CONSTANT |
| CONSTANT | VARIABLE | CONSTANT | CONSTANT | CONSTANT | CONSTANT |
| CONSTANT | VARIABLE | VARIABLE | CONSTANT | CONSTANT | CONSTANT |
| CONSTANT | CONSTANT | CONSTANT | CONSTANT | VARIABLE | CONSTANT |
| CONSTANT | CONSTANT | CONSTANT | VARIABLE | CONSTANT | CONSTANT |
| CONSTANT | CONSTANT | CONSTANT | CONSTANT | CONSTANT | VARIABLE |

FIG. 3

CRITICAL DIMENSION CONTROL BY USE OF PHOTO-SENSITIZED CHEMICALS OR PHOTO-SENSITIZED CHEMICALLY AMPLIFIED RESIST

CROSS REFERENCE TO RELATED APPLICATIONS

This application claims the benefit of U.S. Provisional Patent Application No. 62/335,977, filed on May 13, 2016, entitled "Critical Dimension Control by Use of Photo-Sensitized Chemicals or Photo-Sensitized Chemically Amplified Resist," which is incorporated herein by reference in its entirety.

BACKGROUND OF THE INVENTION

Field of the Invention

This invention relates to patterning critical dimension uniformity (CDU) control. Specifically, the disclosure relates to incorporation of photo-sensitized chemically amplified resist (PSCAR) chemistries into the resist matrix for better/alternative CDU control methods.

Description of Related Art

A PSCAR is a resist composition formulated for a two-exposure treatment to fully create a latent pattern prior to developing the resist. Such double exposure differs from use of conventional photoresists wherein a single exposure of radiation through a mask generates an area of de-protected (positive-tone) or protected (negative-tone) material that defines a soluble or insoluble area for subsequent development. A PSCAR, in contrast, can include a non-chemically selective light exposure followed by a chemically selective light exposure prior to developing the resist. The first (non-chemically selective) exposure of the photoresist material typically occurs through a mask at a first radiation wavelength or wavelength range. This first exposure creates areas in the photoresist that become sensitive to a secondary chemically-selective exposure. The second (chemically selective) exposure, combined traditionally with a bake process, then causes these chemically-sensitive areas to change the solubility of the PSCAR in those areas. In other words, the acid created allows for an autocatalytic de-protection reaction(s) of the polymer backbone at protected sites (typically involving a bake), thus changing the solubility of the resist during a subsequent develop. A target latent image or pattern is then fully created, having the desired de-protection profile, and such a resist film can then be developed into a relief pattern. More details on using photo-sensitized chemically amplified resists can be found in S. Tagawa et al., "Super High Sensitivity Enhancement by Photo-Sensitized Chemically Amplified Resist Process", Journal of Photopolymer Science and Technology, Vol. 26, Number 6 (2013), pp. 825-830.

Use of a PSCAR enables higher sensitivity to photoresist lithographic patterning when photon density is low, such as when using EUV (extreme ultraviolet) wavelengths for exposure patterning. A photosensitizer is created during the initial EUV (or eBeam, or excimer laser such as using krypton fluorine (KrF), argon fluorine (ArF), etc.) exposure by the reaction of intermediates. A subsequent UV (ultra-violet) flood exposure enables the photosensitizer to cause a photo acid generator (PAG) to generate acid, which in turn shifts a solubility of the PSCAR via an autocatalytic de-protection reaction between the generated acid and protected polymer sites. A choice of UV flood wavelength can be based on the particular characteristics of a given photosensitizer. It is typically beneficial to select a wavelength (or wavelength range) that maximizes absorbance by the photosensitizer while minimizing the absorbance by the PAG and precursor to the photosensitizer. Such optimization helps prevent the flood exposure from generating acid in areas in which no photosensitizer has been created. The excited photosensitizer, having absorbed UV light from the UV flood exposure, will then decompose PAGs in proximity to the photosensitizer. This decomposition amplifies acid generation in the exposed area while essentially keeping the lack of acid formation in dark areas from the initial EUV (or eBeam, or excimer laser) exposure. This means avoiding a DC-bias shift in films associated with flood UV exposure.

Although a PSCAR can enable EUV photolithography and other photolithography in which photo density or electron density is low, use of PSCAR patterning can have challenges with critical dimension (CD) uniformity. CD uniformity (CDU) can vary across a surface of a substrate. For example, a given wafer can have one CD value in a center portion of the wafer, while having another CD value closer to an edge of a wafer. A wafer can also have CDs that vary based on order of exposure progression, such as when using a stepper exposure system. Depending on the particular area of a given substrate, CDs may be too large or too small, and the CD variation may be spread randomly across the wafer, may be based on radial location, and/or may correlate with particular features such as location of scribe lanes.

As the industry shrinks continue to push the minimum feature sizes to smaller and smaller critical dimensions, and with the delay and potential cost of EUV (13.5 nm), the industry has looked for processes that further extend their current ArF (193 nm) immersion ($ArF_i$) scanner systems. In multi-patterning, the edge placement error budget is strongly dependent on the overlay and the after-develop inspection (ADI)/after-etch inspection (AEI) CDU. The ability to more tightly control the CDU is of great value and importance.

Historically, CD control of the patterning step (photolithography or etching) has involved one of three methods. The first method is the CD Optimizer (CDO) by TEL, in which critical dimension control is by zonal temperature compensation during post-exposure bake (PEB). The second method is the DoseMapper (DoMa) by ASML, in which critical dimension control is by intrafield and/or interfield dose compensation during exposure. The third method is Hydra by Lam Research, in which critical dimension control is by zonal temperature control during etch.

There is a need for alternative methods for CD control, particularly in combination with PSCAR patterning.

SUMMARY OF THE INVENTION

This disclosure offers an alternative way to minimize patterning CDU and an alternative flow for control/correction. In an embodiment, the method comprises receiving a substrate having an underlying layer and a radiation-sensitive material layer deposited on the underlying layer. The method further comprises exposing a first wavelength of light through a patterned mask onto the radiation-sensitive material layer, the first wavelength of light comprising a wavelength in the UV spectrum; first developing the pattern-exposed radiation-sensitive material layer; flood exposing a second wavelength of light to the first developed radiation-sensitive material layer, the second wavelength of light comprising a wavelength that is different from the first wavelength of light; and second developing the flood-exposed radiation-sensitive material layer to form a radiation-sensitive material pattern. Prior to the step of flood exposing, the radiation-sensitive material comprises a first light wavelength activation threshold that controls the generation of acid to a first acid concentration in the radiation-sensitive material layer and controls generation of photosensitizer molecules in the radiation-sensitive material layer, and a second light wavelength activation threshold that can excite the photosensitizer molecules in the radiation-sensitive material layer that results in the acid comprising a second acid concentration that is greater than the first acid concentration, the second light wavelength activation threshold being different than the first light wavelength activation threshold. The radiation sensitive material pattern comprises a corrected or slimmed critical dimension (CD) across the entire substrate or a portion of the substrate, following the second developing step.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 2 is a graph depicting the selective absorption of UV light with a photosensitizer;

FIG. 3 is a table illustrating the various pathways to alter the radial dose signature delivered within-wafer to alter the final critical dimension uniformity signature.

DETAILED DESCRIPTION

Figure 1A:
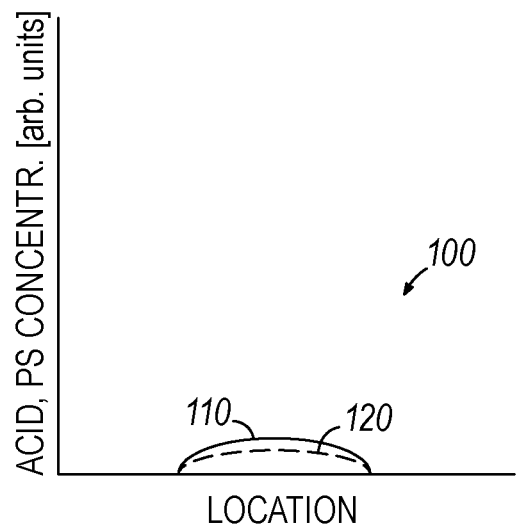
FIG. 1A is a graph depicting the acid and photosensitizer concentrations after a first patterned exposure.
Figure 1B:
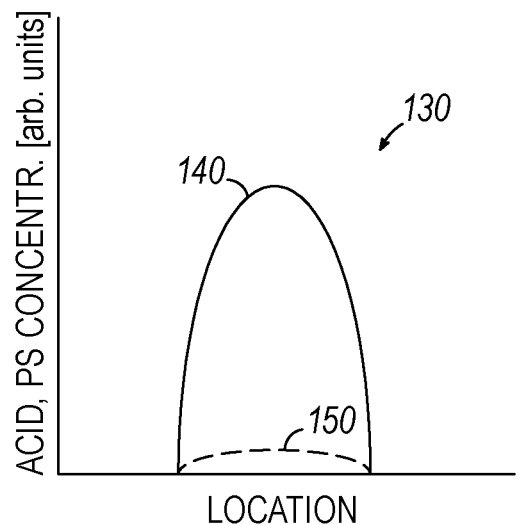
FIG. 1B is a graph depicting the acid and photosensitizer concentrations after a second flood exposure.

The first embodiment of this invention proposes the use of a PSCAR chemistry rather than a conventional CAR chemistry for use as a multi-patterning resist material. A PSCAR includes a photoresist having a segregated activation capability that enables the generation of chemicals within the photoresist to occur at different times and under different process conditions. As shown in graph 100 of FIG. 1A, the PSCAR chemistry creates a background photosensitizer (PS) concentration profile 120 at a time of primary exposure (or during the time between the primary and the secondary exposures) that follows the initial acid concentration profile 110 generated. The primary exposure wavelength can be, but is not limited to, EUV (13.5 nm), ArF (193 nm) (dry or immersion), and/or KrF (248 nm). Some acid may be formed during the primary exposure, for example, from PAGs inside the PSCAR, to form the acid concentration profile 110, although in other embodiments no acid is formed. The secondary exposure wavelength (UV flood) is at an alternative wavelength, often trying to escape the absorption of other components within the resist matrix and thus is usually required to be >300 nm, for example, 365 nm can be used. The PS generated as a result of the primary exposure can then be used to alter the acid generated by amplifying the decomposition of PAGs into acid in subsequent processing. FIG. 1B shows graph 130 of photosensitizer (PS) and acid concentration profiles, 150 and 140, respectively, following the secondary exposure.

With reference to the graph 200 of FIG. 2, an excited photosensitizer, from the UV flood exposure at the secondary exposure wavelength, will decompose PAGs in the proximity of the excited photosensitizer to get amplification of acid generation in the exposed area while essentially keeping the lack of acid formation in the dark area (unexposed) of the original exposure (meaning no significant DC-bias shift of all film associated with flood UV exposure). By increasing the acid in the exposed area only, little acid formation is essentially maintained in dark areas. Because the level of de-protection is directly linked with the acid concentration available to de-protect the polymer, increasing the concentration of acid in lateral feature edges will increase de-protection at lateral feature edges while maintaining a protected state in the center of the feature (in the case of lines and spaces, for example).

In one embodiment, a resist composition is created (or selected) to generate photosensitizer when the resist (as a film) is exposed to a first wavelength range of light. A second wavelength range of light is then used to amplify an acid reaction without using thermal diffusion. The first and second wavelength ranges may or may not overlap. In one embodiment, however, the segregated activation capability may overlap between the photosensitizer and a photo acid generator, such that a relatively small amount of acid may be generated during the first exposure, as seen in FIG. 1A. This relatively small amount of acid may be, for example, less than half an amount of acid that may be generated during a second exposure. Optionally, the photoresist may be optimized to minimize the reaction rate of the acid or an amount of acid that may be generated when the photoresist is exposed to the first wavelength range of light. Acid generation may also be minimized by passing light through a patterned mask that may reduce the amount of light that may intersect with photoresist during the first exposure of light. In the subsequent flood exposure step, the photoresist film is exposed to light again. This subsequent exposure can include a second wavelength range that induces or amplifies the acid concentration within the photoresist film. By way of a non-limiting example, the first wavelength range may be less than 300 nm and the second wavelength range may be greater than 300 nm.

In a conventional photoresist patterning process, a first light exposure activates a PAG at exposure locations such that photo acid is generated at those locations. The photo acid can then change a solubility of the photoresist film via an autocatalytic de-protection reaction between the generated acid and protected polymer sites. In contrast, with a PSCAR film, a mask-based pattern exposure of light, which is at a lower power than the conventional process, primarily creates photosensitizers along with a much smaller amount of acid compared to the conventional process. Photosensitizers can be created or generated by a photosensitizer generation compound, which is a precursor to the photosensitizer, reacting with acid molecules that are in proximity to change the photosensitizer generation molecules into the photosensitizer. This initial mask-based exposure can be considered a low-power exposure relative to the power of the conventional process. Subsequently, a high-power UV flood exposure is executed that creates an enormous amount of acid relative to what was created with the mask-based exposure. Flood exposure herein refers to light exposure without any mask or patterning mechanism so that all portions of a substrate receive about the same amount of radiation.

Embodiments herein can include a resist composition that includes one or more photosensitizer generation compounds. Such compounds respond to a particular light wavelength activation threshold by generating photosensitizer molecules in a photoresist layer or composition. Photosensitizer molecules can absorb light energy and transfer the light energy to another molecule, such as a PAG. This energy transfer can in turn activate the receiving molecule. In the case of a PAG receiving the energy transfer, the PAG can then generate acid. Some photosensitizer compounds may transfer energy in a ground state while others may conduct the transfer in an excited state. Exemplary photosensitizer generation compounds include, but are not limited to, acetophenone, triphenylene, benzophenone, fluorenone, anthraquinone, phenanthrene, or derivatives thereof.

Resist compositions herein can also include a PAG compound that responds to a second light wavelength activation threshold that controls the generation of acid in the photoresist layer. The second activation wavelength can be different than the first activation wavelength. A PAG can be a cationic photoinitiator that converts absorbed light energy into chemical energy (e.g., an acidic reaction). The PAG compound may include, but is not limited to triphenylsulfonium triflate, triphenylsulfonium nonaflate, triphenylsulfonium perfluorooctylsulfonate, triarylsulfonium triflate, triarylsulfonium nonaflate, triarylsulfonium perfluorooctylsulfonate, a triphenylsulfonium salt, a triarylsulfonium salt, a triarylsulfonium hexafluoroantimonate salt, N-hydroxynaphthalimide triflate, 1,1-bis[p-chlorophenyl]-2,2,2-trichloroethane (DDT), 1,1-bis[p-methoxyphenyl]-2,2,2-trichloroethane, 1,2,5,6,9,10-hexabromocyclododecane, 1,10-dibromodecane, 1,1-bis[p-chlorophenyl]2,2-dichloroethane, 4,4-dichloro-2-(trichloromethyl)benzhydrol, 1,1-bis(chlorophenyl) 2-2,2-trichloroethanol, hexachlorodimethylsulfone, 2-chloro-6-(trichloromethyl)pyridine, or derivatives thereof.

Embodiments herein can also include a photoactive agent that can modify acid concentration and/or concentration of a photosensitizer. The photoactive agent can include a second PAG, or a photo-destructive base, also known as a photo-decomposable base. A photo-destructive base can include one or more base compounds that decompose in the exposed areas, which allows for a higher total base loading that can neutralize photoactive acids in the non-exposed areas. A photo-destructive base thus includes compounds that can provide this general base loading effect. The non-decomposed base will denature one or more photo acids such that these photo acids are no longer photo-sensitive, or no longer sensitive to radiation. Common photoresist compositions typically include some type of a base load to help increase contrast to result in crisp lines. This base load typically acts to uniformly adjust acid concentration to provide a uniform profile (remove a gradient exposure). As disclosed herein, by adding more base to a given resist film, a given acid concentration can be reduced. Likewise, a given acid concentration can be increased by selectively adding acid compounds.

In an embodiment, the photosensitizer and/or photosensitizer generator is within the resist matrix from the beginning, but this doesn't preclude it from being dissolved in solution and incorporated via a spin-on process after the first development step, similar to acid rinse processes for slimming, and then subsequently exposed by the UV flood exposure process (at a secondary exposure wavelength), baked, and developed.

In another embodiment, CD within-wafer (WIW) distributions can be de-convolved into radial and tilt components. Radial signatures can be adjusted in one embodiment with the use of a rotating and translating substrate under a light source, during UV flood exposure. This hardware concept allows for many pathways to alter the radial dose signature delivered WIW to alter the final WIW CDU signature. For this embodiment, as shown in FIG. 3, the radial dose alteration can include variable settings for rotation, scan rate, power setting, light source working distance, use of apertures, focal position variation, light source zonal control, etc., to name a few, and any permutations thereof.

In yet another embodiment, the UV flood light energy (at the secondary exposure wavelength), delivered to the wafer can be controlled by use of digital pixel-based projection systems having an array of independently addressable projection points, the projected pattern being based on a CD signature that spatially characterizes CD values of structures. The digital pixel-based projection system can be embodied as a digital light processing (DLP) chip, a grating light valve (GLV), a galvanometer-mounted and -actuated mirror ("galvo-mirror") to direct a light beam, or any other micro projection and/or scanning technology ("Other"), with a light source that can focus an image or pattern (optionally using a lens) onto a wafer and correct or adjust critical dimension non-uniformities. The digital pixel-based projection systems have historically had reliability issues (from absorption issues within the projection system) below 300 nm wavelengths. While there are ways to engineer the operation at lower wavelengths, the absorbance of the PS material, in which 365 nm is a preferred exposure wavelength, allows for potentially more reliable operation. A wavelength of 365 nm is a significantly higher wavelength than that available to photolyze the existing PAGs within a majority of EUV/ArF/KrF resist systems (given historical PAG absorption curves). With this in mind, the use of PSCAR chemistries/methods and subsequent 365 nm flood exposure wavelength use potentially has the benefit of higher projection system lifetime and reliability.

In a further embodiment, UV flood (at secondary exposure wavelength) by rotation/translation methods can be combined with digital pixel-based projection systems (at secondary exposure wavelength) to correct for CD non-uniformities. Given the dose requirements of PSCAR chemistries and the dose limitations of digital pixel-based projection systems, such a combination of techniques may be required. The rotation/translation flood hardware can deliver the majority of the required secondary exposure wavelength (e.g., 97%) and the digital pixel-based projection system can then deliver the remaining dose required for CD non-uniformity minimization (e.g., 0-3% across wafer).

Specific examples of sub-process flows for the UV flood exposure include, but are not limited to:

Sub Flow A: 300-400 nm DLP or GLV or Other→Flood Bake

Sub Flow B: 300-400 nm Rotation/Translation→Flood Bake

Sub Flow C: 300-400 nm DLP or GLV or Other→300-400 nm Rotation/Translation→Flood Bake Sub Flow D: 300-400 nm Rotation/Translation→300-400 nm DLP or GLV or Other→Flood Bake Sub Flow E: 300-400 nm Galvo-mirror→Flood Bake Sub Flow F: 300-400 nm Galvo-mirror→300-400 nm Rotation/Translation→Flood Bake Sub Flow G: 300-400 nm Rotation/Translation→300-400 nm Galvo-mirror→Flood Bake Any other combination of the Sub Flows A-G may be used. The wavelength in the range of 300-400 nm may be 365 nm.

For all embodiments, the ability to maximize the CDU improvement requires the CD distribution be shifted such that the majority of the CDs across the wafer are on one side or the other of the nominal dimension required (depending on the develop tone), such that a secondary exposure has the ability to correct all areas of the wafer. Therefore, when incorporating the secondary PSCAR flood process(es), a shift to slightly under-dosing the primary exposure may be required. In other words, for a PSCAR process, which uses two exposure steps, the exposure dose of the first exposure step is reduced relative to the exposure dose in a CAR process, which uses a single exposure step.

Figure 4:
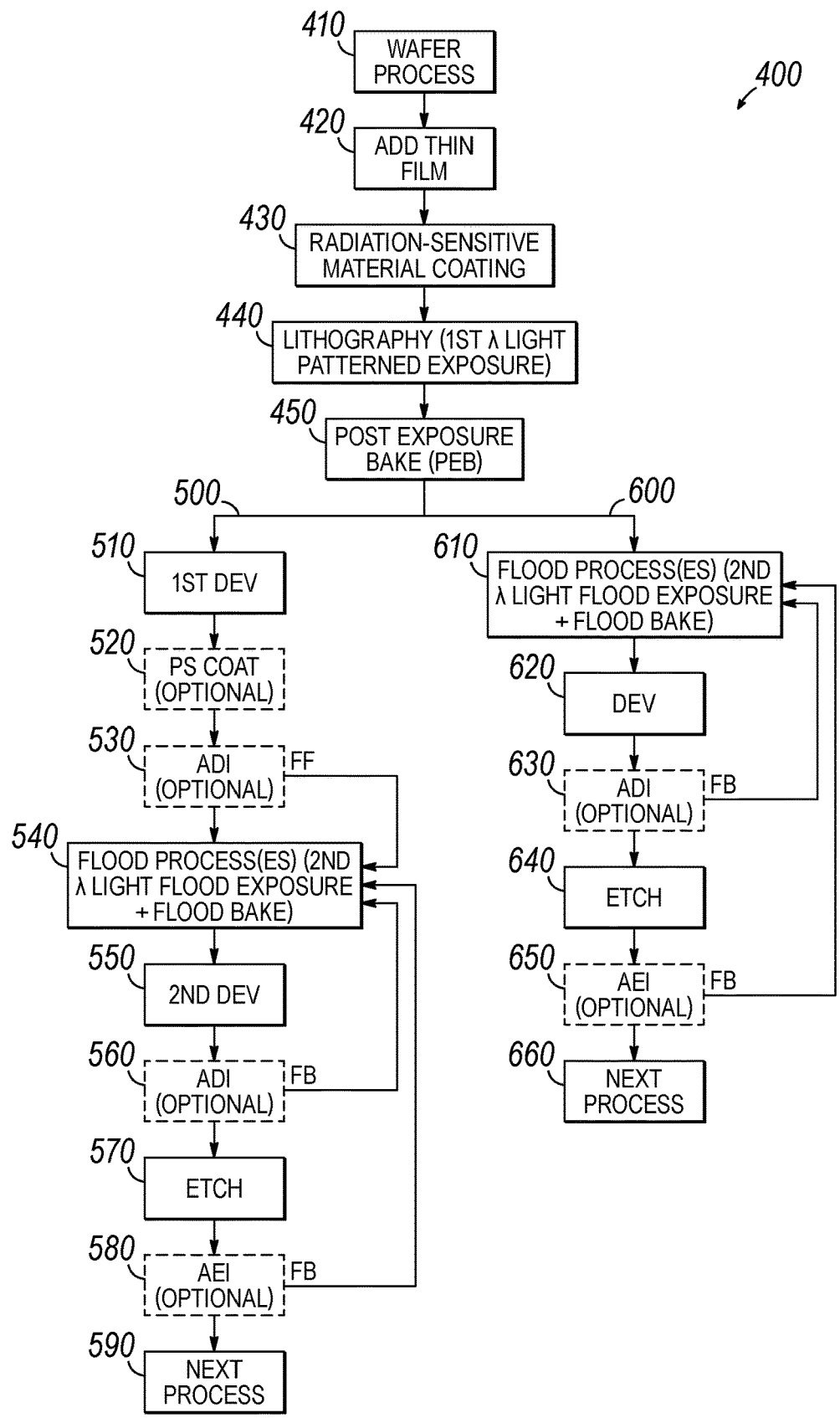
FIG. 4 is a flow chart depicting processes for critical dimension control according to embodiments of the invention.

The embodiments herein offer several process control schemes and wafer sequence options. With regard to wafer sequence options, and as shown in the flow chart 400 of FIG. 4, the secondary exposure(s) (and post-secondary exposure bake) can take place after the primary exposure but before any development (DEV) process(es), as in branch 600 of flow chart 400, or alternatively, they can take place after a primary exposure/PEB/DEV process(es) sequence, as in branch 500 of flow chart 400). In both sequences, the process begins at 410 with initial processing of the wafer. At 420, a thin film is added, which may be referred to as the underlying layer into which a pattern is to be transferred. At 430, a coating of radiation-sensitive material, for example a photoresist, is applied over the thin film. At 440, a lithography process is performed on the radiation-sensitive material coating. More specifically, the radiation-sensitive material coating is exposed through a mask to a first wavelength ($\lambda$) of light, which is in the UV spectrum, to create a patterned exposure. At 450, a post-exposure bake (PEB) is performed.

After 450, the process can proceed in accordance with one embodiment, as indicated by branch 500 of flow chart 400. In 510, the pattern-exposed radiation-sensitive material coating is subjected to a first development process ($1^{ST}$ DEV). Optionally, in 520, the developed radiation-sensitive material coating is coated with a photosensitizer (PS) generation compound or a PS compound to incorporate the PS generation compound or PS compound into the radiation-sensitive material coating. For example, spin-coating may be used to apply the PS generation compound or the PS compound. In the case of coating a PS generation compound, acid present in the pattern-exposed radiation-sensitive material coating may then be reacted with the incorporated PS generation compound. Alternatively, step 520 may be omitted and a PS generation compound may be a component of the radiation-sensitive material coating when applied in 430 over the thin film, which PS generation compound is later reacted to generate PS.

In 540, a flood process (or processes) is performed to flood expose the first developed radiation-sensitive material coating to a second wavelength ($\lambda$) of light, which is different than the first wavelength ($\lambda$) of light. The flood process may include, for example, any of the Sub Flows A-G described above, which include a flood bake. Prior to the flood process (at 540), and after the $1^{ST}$ DEV (at 510), an after-develop inspection (ADI) may optionally be performed, at 530, as part of a feed-forward (FF) control strategy. Specifically, the process parameters of the flood exposure or flood bake in 540 can be altered based on a critical dimension signature obtained from inspecting the first-developed radiation-sensitive material coating, as indicated by the FF arrow in branch 500.

After the flood process, a second development process ($2^{ND}$ DEV) is performed at 550. At 570, the underlying thin film is etched using the patterned radiation-sensitive material coating as a mask. At 590, processing of the wafer continues with a Next Process. A new wafer may then be processed according to the flow chart 400 and branch 500.

Optionally, branch 500 of flow chart 400 may include ADI at 560 and/or an after-etch inspection (AEI) at 580, in which the wafer is inspected after the $2^{ND}$ DEV at 550 and/or after the etch at 570, respectively, as part of a feed-back (FB) control strategy. Specifically, the process parameters of the flood exposure or flood bake in 540 can be altered for a next wafer being processed based on a critical dimension signature obtained from inspecting the second-developed radiation-sensitive material coating and/or the etched underlying thin film layer, as indicated by the FB arrows in branch 500.

After 450, the process of flow chart 400 can proceed in accordance with an alternative embodiment, as indicated by branch 600. In 610, a flood process (or processes) is performed to flood expose the pattern-exposed radiation-sensitive material coating to a second wavelength ($\lambda$) of light, which is different than the first wavelength ($\lambda$) of light. As with 540, the flood process 610 may include any of the Sub Flows A-G described above.

After the flood process, a development process (DEV) is performed at 620, which is the only DEV step of this process flow. At 640, the underlying thin film is etched using the patterned radiation-sensitive material coating as a mask. At 660, processing of the wafer continues with a Next Process. A new wafer may then be processed according to the flow chart 400 and branch 600.

Optionally, branch 600 of flow chart 400 may include ADI at 630 and/or AEI at 650, in which the wafer is inspected after the DEV at 620 and/or after the etch at 640, respectively, as a part of a FB control strategy. Specifically, the process parameters of the flood exposure or flood bake in 610 can be altered for a next wafer being processed based on a critical dimension signature obtained from inspecting the developed radiation-sensitive material coating and/or the etched underlying thin film layer, as indicated by the FB arrows in branch 600.

Prior to the flood exposure in 540 or 610, the radiation-sensitive material coating comprises a first light wavelength activation threshold that controls the generation of acid to a first acid concentration in the radiation-sensitive material and controls generation of photosensitizer molecules in the radiation-sensitive material, and a second light wavelength activation threshold that can excite the photosensitizer molecules in the radiation-sensitive material that results in the acid comprising a second acid concentration that is greater than the first acid concentration, the second light wavelength activation threshold being different than the first light wavelength activation threshold. In an embodiment, the first wavelength of light (in 440) is at or above the first light wavelength activation threshold and lower than the second light wavelength activation threshold, and the second wavelength of light (in 540 or 610) is at or above the second light wavelength activation threshold.

With regard to process control schemes, there are several feedback (FB) or feedforward (FF) control schemes that can be used independently, or in conjunction with one another, as discussed above with reference to flow chart 400. Averaged after-etch inspection (AEI) results can be fed back to facilitate lot-level average power setting and/or WIW power signature adjustments to correct for fluctuations observed with AEI. The source of fluctuations can be inherent to the etch process, lithography process, and other processing steps. Likewise, averaged after-develop inspection (ADI) results can be fed back to facilitate lot-level average power setting and/or WIW power signature adjustments to correct for fluctuations observed with ADI. In cases with 2 development steps (e.g., 510 and 550), ADI results can be used from either ADI step (e.g., 530 and 560), and be fed back for next wafer process control. Specific to doing an ADI step post $1^{ST}$ DEV (e.g., 510), but prior to the flood process(es) (e.g., 540) and $2^{ND}$ DEV (e.g., 550), feed forward control strategies at the wafer level are enabled. A known ADI CD map can be fed forward into the flood controller to augment the flood process (dose delivered locally within-wafer) specific to that wafer for tighter final CD distribution at ADI. Any of the above control schemes used by themselves, or in conjunction, could lead to tighter patterning CD control.

These concepts offer an alternative way to achieve a minimized ADI/AEI CDU. CDU control is herein largely controlled by UV flood dose control module(s).

With this modified approach to patterning CDU control, WIW control schemes can also be more realizable; they can make use of actual WIW information to feed forward to secondary exposure to allow for tighter patterning CD control.

In addition to these methods being used for critical dimension (CD) correction, i.e., CDU correction around the post-photolithography target mean, the same method of making use of higher flood doses can be used for slimming/shrinking critical dimensions (CD) across the substrate or a portion of the substrate. As industry shrinks continue to push minimum feature size requirements to smaller and smaller CDs, and with the delay and potential high cost of EUV (13.5 nm), the industry has looked for processes that extend their current 193 nm immersion (ArF$_i$) scanner systems infrastructure/expertise further. Shrinking/slimming of the traditional post photolithography ArF$_i$ near resolution-limited (e.g., ~40 nm lines and spaces) resist features is one such extension. The ability to shrink holes or trenches and/or slim or trim lines by 10, 20, 30 nanometers in a controlled wet process has current and future applications in: (1) single patterning, such as in logic design where gate layers have very small features on a slightly less aggressive pitch, and (2) double patterning/multi-patterning schemes, such as in Litho-Etch-Litho-Etch (LELE) or Litho-Etch repeated "n" times (LE$^n$), Litho-Litho-Etch (LLE), and precursors for sidewall spacers.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method, comprising:
   receiving a substrate, the substrate comprising:
   an underlying layer, and
   a radiation-sensitive material layer on the underlying layer and including a photoacid generator and having a first light wavelength activation threshold such that when the radiation-sensitive material layer is exposed to a wavelength of light equal to or longer than the first light wavelength activation threshold, the photoacid generator generates an acid;
   exposing a first wavelength of light through a patterned mask onto the radiation-sensitive material layer, the first wavelength of light comprising a wavelength in the UV spectrum that is equal to or longer than the first light wavelength activation threshold so as to generate the acid;
   first developing the pattern-exposed radiation-sensitive material layer, the first developed radiation-sensitive material layer having a first CD uniformity;
   flood exposing a second wavelength of light to the first developed radiation-sensitive material layer, wherein the first developed-radiation sensitive material layer includes photosensitizer molecules and has a second light wavelength activation threshold such that when the first developed-radiation sensitive material layer is exposed to the second wavelength of light that is equal to or longer than the second light wavelength activation threshold, the photosensitizer molecules generate more of the acid, the second wavelength of light comprising a wavelength that is different from the first wavelength of light; and
   second developing the flood-exposed radiation-sensitive material layer to form a radiation-sensitive material pattern having a second CD uniformity that is improved relative to the first CD uniformity,
   wherein the radiation-sensitive material pattern comprises a corrected or slimmed critical dimension (CD) related to the second CD uniformity across the entire substrate or a portion of the substrate, following the second developing step.

2. The method of claim 1, wherein the radiation-sensitive material comprises the photosensitizer molecules as a component of the radiation-sensitive material.

3. The method of claim 1, further comprising:
coating a photosensitizer generation compound that includes the photosensitizer molecules onto the radiation-sensitive material layer following the first developing step and before the flood exposing, to incorporate the photosensitizer molecules into the radiation-sensitive material layer.

4. The method of claim 3, wherein the coating the photosensitizer generation compound comprises spin-coating.

5. The method of claim 1, wherein the first wavelength of light is shorter than the second light wavelength activation threshold.

6. The method of claim 1, wherein the first wavelength of light is 13.5 nm, 193 nm, or 248 nm.

7. The method of claim 1, wherein the second wavelength of light is in the UV spectrum.

8. The method of claim 1, wherein the second wavelength of light is between 300 and 400 nm.

9. The method of claim 1, wherein the second wavelength of light is 365 nm.

10. The method of claim 1, wherein the step of flood exposing comprises exposing the developed radiation-sensitive material layer to the second wavelength of light using a pixel-based projection system.

11. The method of claim 1, wherein the step of flood exposing comprises exposing the developed radiation sensitive material layer to the second wavelength of light directed by a galvanometer-mounted mirror.

12. The method of claim 1, wherein the step of flood exposing comprises translating or rotating, or both, the substrate under a light source at the second wavelength of light.

13. The method of claim 1, wherein the exposure dose of the exposure of the radiation-sensitive material layer to the first wavelength of light is reduced relative to a process comprising a patterned exposure without a subsequent flood exposure to allow critical dimension (CD) correction across the entire substrate in subsequent process steps.

14. The method of claim 1, further comprising:
inspecting the radiation-sensitive material layer following the first developing, or following the second developing, or both.

15. The method of claim 14, further comprising:
altering the process parameters of the flood exposure step or a bake step following the flood exposure step, or both, based on the first CD uniformity obtained from inspecting the radiation-sensitive material layer following the first developing.

16. The method of claim 14, further comprising:
altering the process parameters of the flood exposure step or a bake step following the flood exposure step, or both, for a next wafer based on the second CD uniformity obtained from inspecting the radiation-sensitive material layer following the second developing.

17. The method of claim 1, further comprising:
etching the underlying layer using the radiation-sensitive material pattern as a mask.

18. The method of claim 17, further comprising:
inspecting the etched underlying layer.

19. The method of claim 18, further comprising:
altering the process parameters of the flood exposure step or a bake step following the flood exposure step, or both, for a next wafer based on a critical dimension signature obtained from inspecting the etched underlying layer.

20. The method of claim 1, wherein following first developing, the first developed radiation-sensitive material layer has a pattern having a first CD at a location, and following second developing, the radiation-sensitive material pattern has a second CD related to the first CD at the location, the second CD being less than the first CD.

21. The method of claim 20, wherein flood exposing includes selectively directing a light beam onto the pattern according to spatially characterized CD values measured across the pattern and from which the first CD uniformity is determined.

22. The method of claim 20, wherein the second CD is within 30 nm of the first CD.

23. The method of claim 20, wherein the second CD is within 20 nm of the first CD.

24. The method of claim 20, wherein the second CD is within 10 nm of the first CD.

25. The method of claim 20, wherein following exposing the first wavelength of light and before the first developing, the method further includes a post-exposure bake.

26. A method for critical dimension uniformity control using a radiation-sensitive material including a photoacid generator having a first light wavelength activation threshold such that the radiation-sensitive material is exposed to a wavelength of light equal to or longer than the first light wavelength activation threshold, the photoacid generator generates an acid, the method comprising:
receiving a substrate comprising an underlying layer and a layer of the radiation-sensitive material on the underlying layer;
exposing the layer of the radiation-sensitive material to a first wavelength of light through a patterned mask, the first wavelength of light including a wavelength in the UV spectrum that is equal to or longer than the first light wavelength activation threshold so as to generate the acid in the layer of the radiation-sensitive material;
developing a pattern in the layer of the radiation-sensitive material having a plurality of features, each feature being characterized by a critical dimension (CD), a plurality of CDs forming a first distribution of CDs having a first CD uniformity;
flood exposing the pattern to a second wavelength of light different from the first wavelength of light, wherein the layer of the radiation-sensitive material includes photosensitizer molecules having a second light wavelength activation threshold such that during flood exposing to the second wavelength of light that is equal to or longer than the second light wavelength activation threshold, the photosensitizer molecules generate more of the acid, and during flood exposing, light is nonuniformly distributed onto the pattern according to at least one the first distribution of CDs and the first CD uniformity; and
developing the flood-exposed pattern, wherein the plurality of features is characterized by a second distribution of CDs having a second CD uniformity related to the nonuniform light distribution so that the second distribution of CDs is shifted relative to the first distribution of CDs,
wherein the majority of the CDs of the first distribution of CDs is larger than a nominal dimension required and the second distribution of CDs is shifted toward the nominal dimension required.

* * * * *